United States Patent [19]
Glass et al.

[11] Patent Number: 5,363,398
[45] Date of Patent: Nov. 8, 1994

[54] ABSORPTION RESONANT RARE EARTH-DOPED MICRO-CAVITIES

[75] Inventors: Alastair M. Glass, Rumson; Neil E. J. Hunt, Scotch Plains; John M. Poate, Summit; Erdmann F. Schubert, New Providence; George J. Zydzik, Columbia, all of N.J.

[73] Assignee: AT&T Bell Laboratories, Murray Hill, N.J.

[21] Appl. No.: 129,528

[22] Filed: Sep. 30, 1993

[51] Int. Cl.$^5$ .............................................. H01S 3/08
[52] U.S. Cl. .................................. 372/92; 372/45
[58] Field of Search ............... 372/45, 49, 92, 96, 372/99; 257/86, 98, 102, 103

[56] References Cited

U.S. PATENT DOCUMENTS

| | | | |
|---|---|---|---|
| 4,081,763 | 3/1978 | Vlasenko et al. | 372/43 |
| 5,202,786 | 4/1993 | Boyle et al. | 372/11 |
| 5,226,053 | 7/1993 | Cho et al. | 372/45 |
| 5,237,576 | 8/1993 | DiGiovanni et al. | 372/6 |
| 5,249,195 | 9/1993 | Feldman et al. | 372/45 |

Primary Examiner—Rodney B. Bovernick
Assistant Examiner—Robert E. Wise
Attorney, Agent, or Firm—Oleg E. Alber

[57] ABSTRACT

Absorption properties of an optically active medium can be changed drastically by a Fabry-Perot microcavity. Optically active medium of the cavity includes a host material which is not optically active and at least one rare earth ion which provides optical activity to the medium. The Fabry-Perot cavity is designed to be resonant with excitation wavelength of an absorption band of the host material. The excitation is provided by a source of radiation positioned such that the radiation impinges on the cavity at an angle within a range of from zero to less than 90 degrees from the normal to the top surface of the cavity. In one embodiment Er-implanted $SiO_2$ is used as the optically active medium. $SiO_2$:Er has an absorption band at 980 nm and an emission band at 1.55 $\mu$m due to 4f intra-atomic transitions of $Er^{3+}$ ions. The Fabry-Perot cavity is designed to be resonant with the 980 nm absorption band of $SiO_2$:Er. The efficiency of the cavity structure is much higher as compared to a no-cavity structure, while the spectral features of the active $SiO_2$:Er emission are unaltered. The structure can be used for optically pumped semiconductor devices, such as optical amplifiers or lasers, which could be operated with a higher overall efficiency.

14 Claims, 6 Drawing Sheets

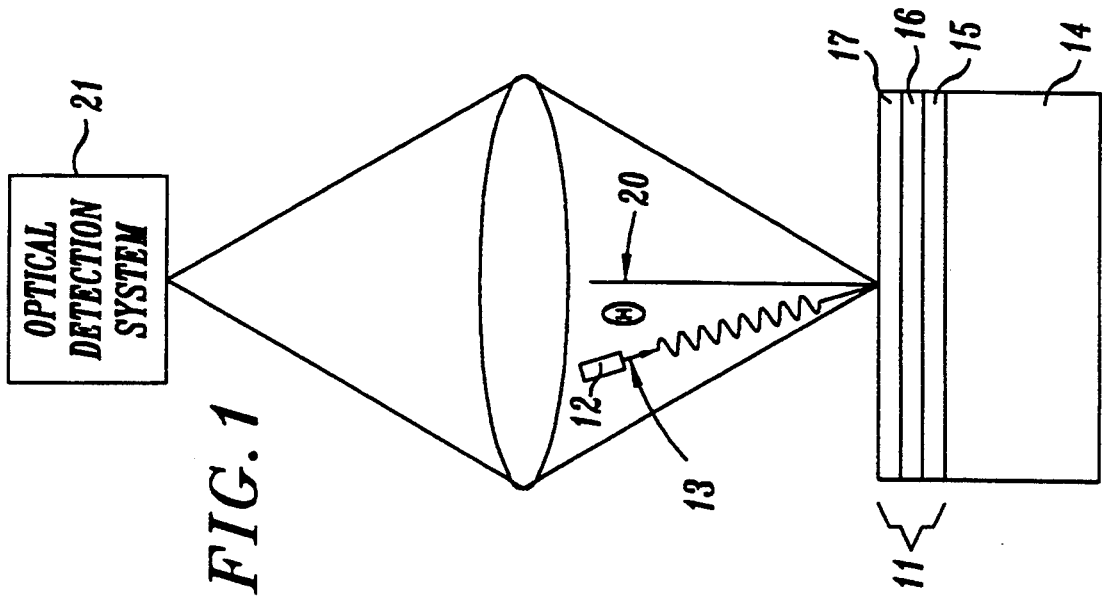
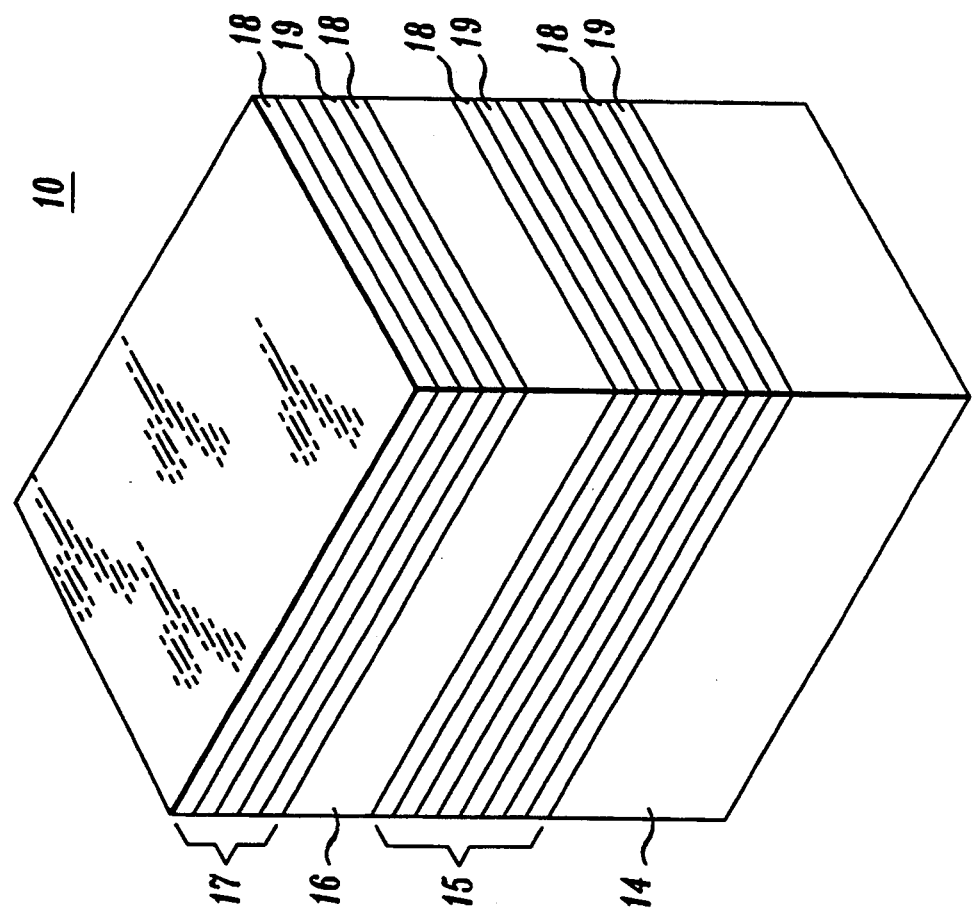

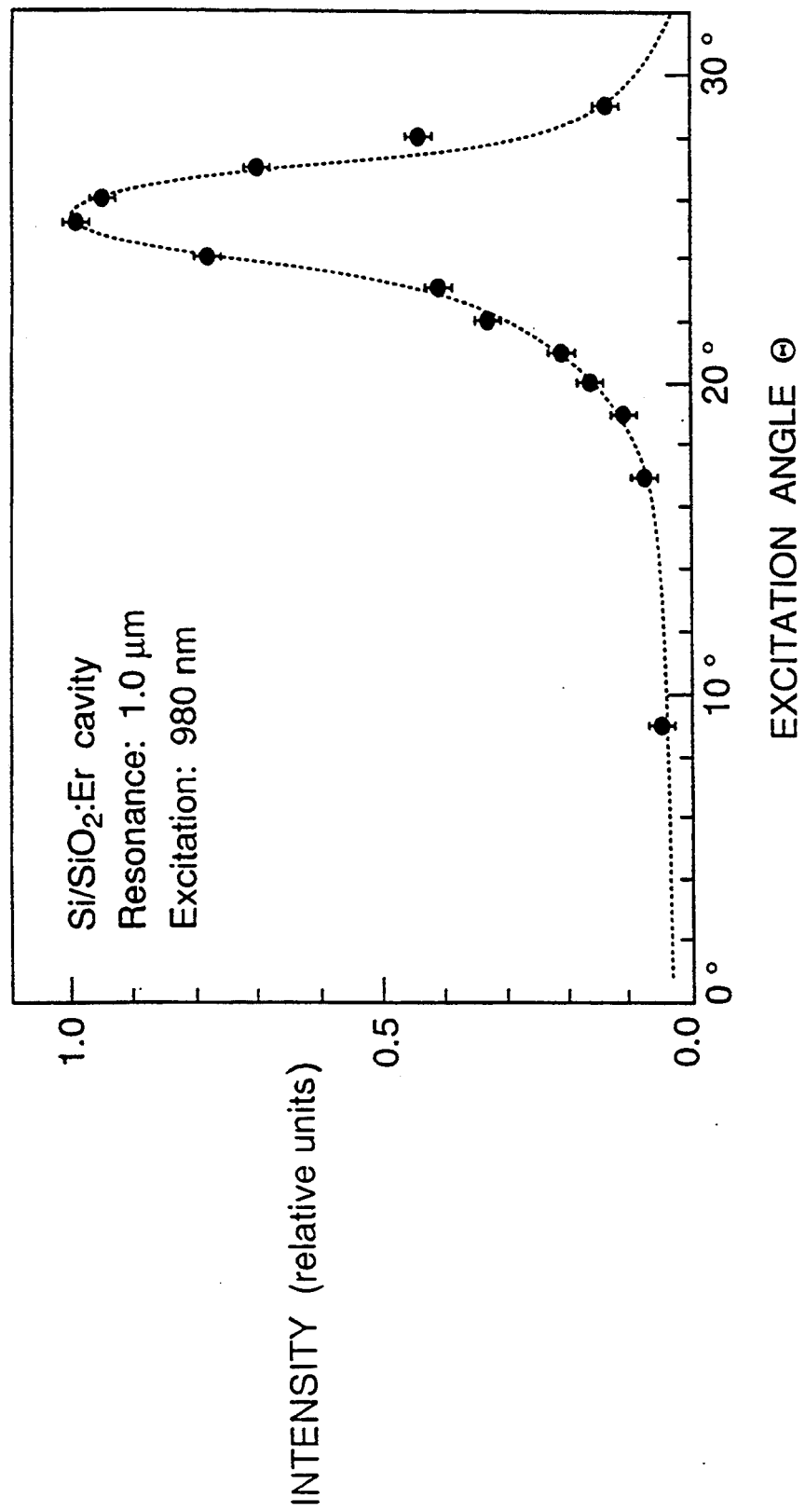

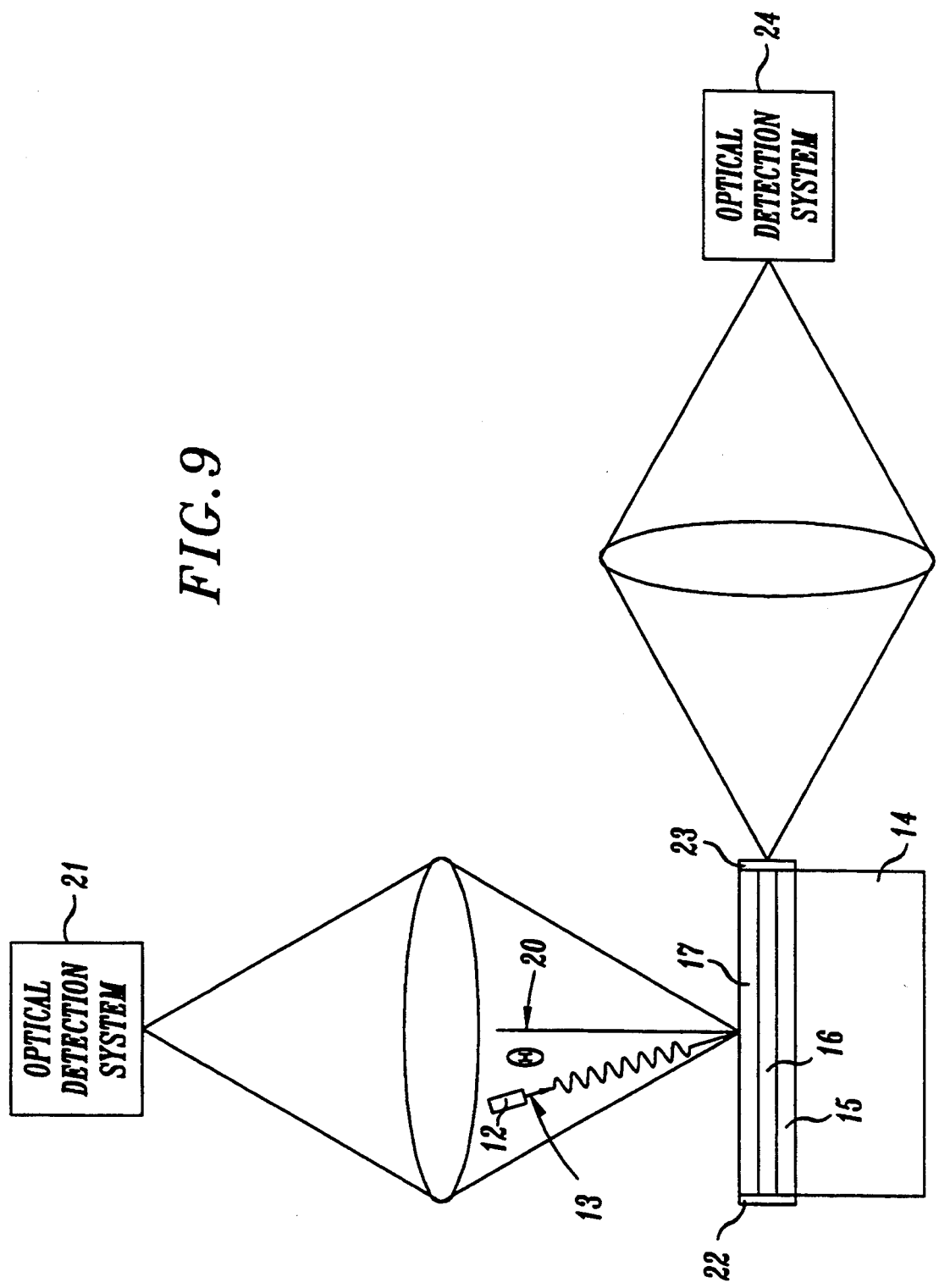

ABSORPTION RESONANT RARE EARTH-DOPED MICRO-CAVITIES

FIELD OF THE INVENTION

This invention pertains to optical devices having a rare earth element-doped active region within a Fabry-Perot cavity, and especially to devices having an erbium-doped active region.

BACKGROUND OF THE INVENTION

The incorporation of rare earth ions of lanthanide series of elements with numbers ranging from 57 to 71 of the Mendeleev's periodic system in glasses has led to the development of optical fiber lasers and amplifiers. Current interest is directed towards erbium-doped fibers for the fabrication of non-planar light-emitting devices, such as optical fiber lasers and amplifiers emitting at 1.53–1.55 $\mu$m signal wavelength. Although such non-planar light-emitting devices can advantageously be used in a variety of communications systems, there are many potential applications for light-emitting devices for which non-planar devices are not readily or conveniently adapted. For instance, it would be desirable to integrate planar devices emitting at 1.53–1.55 $\mu$m signal wavelength with electronic and opto-electronic devices or structures. Such planar devices are desirable replacements for the non-planar devices, due to their compact nature and increased mechanical stability, and are likely to find applications in lightwave communications systems.

Recently it was shown that a planar optical device with a Fabry-Perot cavity may be formed by two reflectors and an active layer which is doped with a rare earth element selected from lanthanide series elements with numbers 57 through 71. See U.S. patent application Ser. No. 07/906,910 filed on Jun. 30, 1992 in the name of Feldman et al., now U.S. Pat. No. 5,249,195, which is incorporated herein by reference. The fundamental mode of the cavity is in resonance with the emission wavelength of the selected rare earth element. In such a device, the operating wavelength fully depends on the wavelength of emission from an implanted ion. In a specific example of the Feldman et al. invention, a Fabry-Perot microcavity, grown on a Si substrate, consists of two Si/SiO$_2$ distributed Bragg reflectors (DBRs) and an Er-doped SiO$_2$ active region. Er is incorporated into the center of the SiO$_2$ layer of the cavity as optically active Er atoms in SiO$_2$. The fundamental mode of the cavity is in resonance with the 1.55 $\mu$m emission of a 4f electronic transition of Er$^{3+}$ atoms in SiO$_2$. This leads to excellent emission characteristics, including the spontaneous emission intensity, spectral finesse and emission lifetime, as compared to a no cavity structure, e.g., to a structure having only a bottom reflector and a rare-earth doped active layer.

It is desirable to further improve luminescence efficiency of such planar optical devices.

SUMMARY OF THE INVENTION

Absorption properties of an optically active medium can be changed drastically by a Fabry-Perot microcavity. Optically active medium of the cavity includes a host material which is not optically active and at least one rare earth ion which provides optical activity to the medium. The Fabry-Perot cavity is designed to be resonant with excitation wavelength of an absorption band of the host material. The excitation is provided by a source of radiation positioned such that the radiation impinges on the cavity at an angle within a range of from zero to less than 90 degrees from the normal to the top surface of the cavity. In one embodiment Er-implanted SiO$_2$ is used as the optically active medium. SiO$_2$:Er has an absorption band at 980 nm and an emission band at 1.55 $\mu$m due to 4f intra-atomic transitions of Er$^{3+}$ ions. The Fabry-Perot cavity is designed to be resonant with the 980 nm absorption band of SiO$_2$:Er. The efficiency of the cavity structure is much higher as compared to a no-cavity structure, while the spectral features of the active SiO$_2$:Er emission are unaltered. The structure can be used for optically pumped semiconductor devices, such as optical amplifiers or lasers, which could be operated with a higher overall efficiency.

BRIEF DESCRIPTION OF THE DRAWING

FIG. 1 discloses a set-up for measuring photoluminescence of a rare-earth doped Fabry-Perot microcavity optically pumped by a semiconductor laser;

FIG. 2 discloses a schematic structure of an exemplary resonant cavity structure grown with a rare earth-doped active layer and distributed Bragg reflectors (DBRs) on a substrate;

FIG. 8 is a plot of a room-temperature photoluminescence peak intensity (at $\lambda$=1.535 $\mu$m) of an Er-doped Si/SiO$_2$ cavity resonant at the excitation wavelength of 980 nm versus excitation angle; and FIG. 9 discloses a set-up similar to that of FIG. 1 but in which the cavity is provided with additional reflectors on the sidewalls of the cavity with emission taking place through one of the sidewalls.

DETAILED DESCRIPTION

Figure 3:
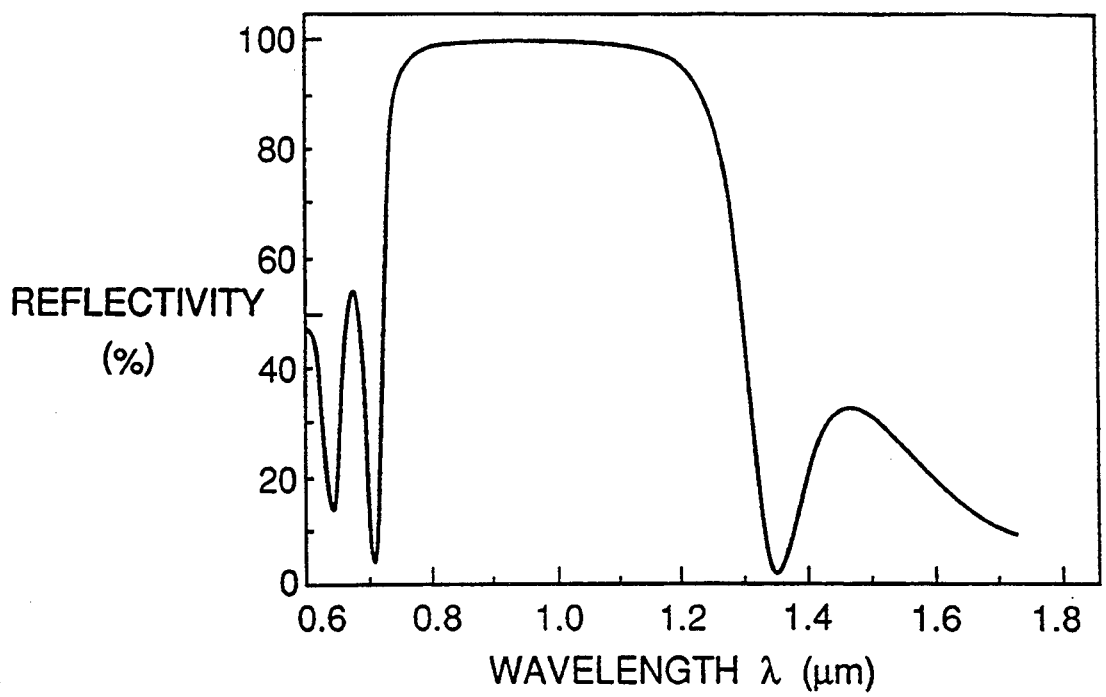
FIG. 3 is a plot of reflectivity for a structure with four pairs of Si/SiO$_2$ bottom DBR clad by a $\lambda$/2 SiO$_2$:Er active region.

In all optically pumped devices, an active region (semiconductor, rare earth doped glass, dye, etc.) is pumped by an excitation source. If the active region is thin or if the active medium is weakly absorbing, then most of the exciting light is not being absorbed when passing through the active medium. Thus, the excitation efficiency is very low. This problem can be alleviated by using absorption-resonant micro-cavities. If the cavity is resonant with the excitation wavelength, then the exciting light will be reflected many times (depending on the reflectivities and finesse) and will be confined inside the cavity. Using this cavity effect, effective excitation can be achieved even for thin active regions and for optical media with a small absorption coefficient.

In FIG. 1 is shown a schematic illustration of a setup for measuring photoluminescence of an optical device, 10, with a rare-earth doped micro-cavity, 11, optically pumped by a semiconductor laser, 12, with excitation radiation, 13, impinging on the cavity at an adjustable angle Θ from the normal to the surface of the microcavity. The microcavity, which is resonant at the excitation wavelength of the laser, includes, in an ascending order from a substrate, 14, a bottom reflector, 15, an active layer, 16, and a top reflector, 17.

Substrate 14 may be of a number of materials being used in the intergated circuits, such as semiconductors, glasses, ceramics, etc. Silicon would be especially useful, since many integrated circuits are grown on Si substrates.

Reflectors 15 and 17, placed on opposite sides of active layer 16, form with the active layer a resonant Fabry-Perot cavity. The reflectors should have reflectivity of at least 90 percent, preferably of at least 95 percent. In those instances where the emission takes place through the surface of the device, one of the reflectors is made to be more reflective than the other, with emission taking place through a less reflective mirror. In those instances where the emission takes place through the sidewalls of the active layer, the reflectivities of the two reflectors may be the same. Both of these reflectors may be in the form of thin metal films, distributed Bragg reflectors (DBRs), layers of conductive semi-transmissive oxides, and suitable combinations of these. A metal may be selected from such metals as Ag, Au, Al, Cr and Cu. The DBRs are typically in the form of pairs of materials with different refractive index. These materials are selectable from semiconductors, conductive oxides, glasses and glass-like oxides. The semiconductive materials may be selected from tetrahedrally bonded semiconductor materials such as Si, Ge, GaAs, GaP, InP, GaInAs, GaInPAs, and semiconductor materials, such as ZnS,ZnSe. Conductive oxides may be selected from cadmium tin oxide (CTO) and indium tin oxide (ITO). The glasses may be selected from $SiO_2$, phosphosilicates, borosilicates and borophosphosilicates, boronaluminum silicates, germanates, tellurites and fluorides, and glass-like oxides from $Al_2O_3$ and $TiO_2$.

Each DBR consists of a plurality of pairs of quarter-wave layers, e.g. 18 and 19, the number of pairs in bottom reflector 15 being greater than the number of pairs in top reflector 17. Each pair includes a layer having an index of refraction which is higher than the index of refraction of another layer of the pair. The layers in the bottom and the top DBRs are deposited such that layers with higher index of refraction of each reflector are adjacent to the active layer with lower index of refraction.

Active layer 16 includes a host material containing a rare earth dopant. The undoped host material when subjected to light excitation is either not capable of spontaneous luminescence or whose luminescence is of such minor intensity as not to be considered as being emissive at the emission wavelength of the rare earth element. Glasses such as $SiO_2$, phosphosilicate glass, borosilicate glass, borophosphosilicate glass, boronaluminum silicate glass, germanate glass, tellurite glass, fluoride glass and such glass-like materials as oxides, e.g. $Al_2O_3$, $TiO_2$, or nitrides, e.g. $Si_3N_4$, belong to the former, while tetrahedrally bonded semiconductor materials such as Si, Ge, GaAs, GaP, InP, GaInAs, GaInPAs, semiconductor materials such as ZnS, ZnSe, and conductive oxides such as $CdSnO_3$ and $InSnO_3$, belong to the latter.

Glasses, when subjected to light excitation, normally do not produce spontaneous photoluminescence. Semiconductors may provide only minor spontaneous photoluminescence but at wavelengths which are not located at a desired preferred emission wavelengths. This deficiency is overcome by providing the glass (or semiconductor) material with ions which, upon being subjected to excitation with light, lead to a pronounced spontaneous luminescence. Thus, the host material layer is doped with ions of at least one rare earth element of lanthanide series of elements with atomic members 57 to 71 of the Mendeleev's Periodic Table. Depending on the host material of the active layer, the dopant may be incorporated in a well-known manner, such as by implantation or sputtering with subsequent annealing, or by MBE, CVD or OMVPE during the growth of the active layer. The important condition is that the majority of the dopant ions be confined to the active layer.

In accordance with this invention, the materials forming the cavity, the length of the cavity, that is the thickness of the active layer, the wavelength of a device, such as a laser, being used as a source of excitation radiation, and an angle Θ of incidence on the surface of a top reflector are preselected such that the cavity is absorption resonant at the wavelength of the excitation radiation, rather than at the wavelength of spontaneous emission of the rare earth element. The angle Θ is adjustable within a range of from zero degrees to less than 90 degrees from the normal to the surface of the top reflector. The thickness of active layer 16 is a whole number multiple of $\lambda/2$ and the thickness of each of layers 18 and 19 is equal to $\lambda/4$, wherein $\lambda$ is an excitation wavelength of the device. Note that $\lambda$ is a wavelength in air and for different materials, e.g. $m_1$ and $m_2$, has a length of $\lambda/n_{m1}$ and $\lambda/n_{m2}$, where $n_{m1}$ and $n_{m2}$ are the indexis of refraction of these materials. The whole number is selected from a range of from 1 to 5 to provide, in combination with reflectors 15 and 17, a resonant cavity for the spontaneous emission of the selected rare earth dopant. Since layers 18 are of different material and have different refractive index than layers 19, layers 18 differ from layers 19 in thickness, also.

The present invention is described with reference to a specific exemplary embodiment in which erbium (Er) is the preferred rare earth element and the materials of the cavity are Si and $SiO_2$. Er is one of the rare-earth elements which are widely used in optical telecommunication technology because of its optical transition at about 1.5 μm which coincides with the minimum loss window in silica fibers. The laser, being used as a source of excitation radiation, has an excitation wavelength of 980 nanometers (nm).

In the specific exemplary embodiment, device 10 comprises Si substrate 14, bottom DBR 15, Er-doped $SiO_2$ active region 16, and top DBR 17. The bottom and top DBRs consist respectively of pairs of quarterwave layers 18 of Si and quarterwave layers 19 of $SiO_2$. For use of the device with laser having an excitation wavelength of 980 nm, thickness of each Si layer 18 with $n \approx 3.3$ equals to $\lambda/4 \approx 730$ Å, and of each $SiO_2$ layer 19 with $n \approx 1.5$ equals to $\lambda/4 \approx 1700$ Å. The $SiO_2$ active region has a thickness of 3400 Å corresponding to $\lambda/2$, the thickness of the active region being one half the 980 nm wavelength divided by the refractive index of $SiO_2$. The bottom DBR consists of 4 pairs of layers 18 and 19, and the top DBR consists of $2\frac{1}{2}$ pairs of layers 18 and 19. The uppermost layer 18 of top DBR 17 acts as a cupping layer. Thus, cavity 11, grown on a Si substrate, consists of bottom DBR 15 with 4 pairs of a $SiO_2$/Si (1700 Å/730 Å), Er-doped $SiO_2$ (3400 Å) active region 16, and top DBR 17 with $2\frac{1}{2}$ pairs of a Si/$SiO_2$ (730 Å/1700 Å). The reflectivities of the bottom and top DBR are 99.8% and 98.5%, respectively.

The growth conditions, the Er implantation dose, and the post-implantation annealing conditions are as follows. Si layers 18 were deposited by dc-magnetron sputtering at a rate of 125 Å/sec. and $SiO_2$ layers 19 were deposited by rf-magnetron sputtering at a rate of 30 Å/sec. The sputtering was conducted by tandem deposition using a Model No. 603 Sputtering System available from Materials Research Corporation. Alternatively the Si and $SiO_2$ layers may be deposited by electron beam evaporation, for example, from side-by-side sources of the two materials, with a shutter interrupting the deposition, as needed. These layers may also be deposited by MBE or OMVPE, for example, when it is desirable to deposit both the layers of the mirrors and the host material of the active layer in one procedure. Subsequently to the e-beam evaporation deposition of Si and $SiO_2$ layers, an area of the top reflector was ion implanted through Si capping layer 18 with Er at a dose of $7.7 \times 10^{15}$ cm$^{-2}$ and with an implantation energy of 2.35 MeV. The projected range of the implant into the structure is 0.73 $\mu$m, i.e., the maximum of the Er concentration occurs in the center of $SiO_2$ active region 16, i.e., at the antinode of an optical standing wave. The projected straggle of the implant is 0.167 $\mu$m demonstrating that the implanted Er is mostly confined to the active region. Post-implantation anneal to correct any damage caused by Er ion implantation was carried out at 700°–900° C. for 30 minutes. Alternatively, the Er ion may be deposited on top of the host material of the active layer by sputtering or e-beam evaporation followed by an anneal. Er may also be incorporated into the host material of the active layer during an MBE growth of the structure.

To make possible the comparison of structures with and without cavity, that is with and without the top DBR, respectively, the top reflector on some of the samples was removed to form a no-cavity structure. The no-cavity structure was fabricated by etching off the top DBR of the cavity structure shown in FIG. 2. The employment of highly selective wet chemical etchants allows for the selective removal of the top reflector only. For example, HF or a buffered oxide HF etchant (BOE) may be used for removal of $SiO_2$ (100 nm/min) and KOH dissolved in water and heated at 80° C. may be used for removal of Si (30 nm/min). For other materials some other etchants may be selected as is well known in the art.

To determine whether or not the pumping device would be suitable as a source of excitation radiation for the cavity, a number of experiments were conducted utilizing a no-cavity structure and a cavity structure. All experiments were carried out at room temperature.

Reflectivity measurements of the no-cavity structure and of the microcavity were carded out using a tungsten halogen incandescent lamp and an optical spectrum analyzer (Anritsu). A silver mirror served as a reflectivity standard. These reflectivities were measured at an incident angle of 9.5°, i.e. close to normal incidence. The reflectivity spectra were measured in the Er-implanted part of the water as well as in unimplanted parts of the wafer. No noticeable difference was found in the reflectivity spectra between the two regions. The resonance wavelength varied weakly across the 2.5 cm $\times$ 2.5 cm wafer between 0.995 $\mu$m and 1.05 $\mu$m.

The reflectivity plot of the spectra of the no-cavity structure, with the 4 pair $SiO_2$/Si bottom DBR clad by the Er-doped $SiO_2$ active region and without the top DBR, is shown in FIG. 3. The reflectivity spectrum of the bottom reflector displays a broad band of high reflectivity in the wavelength range 0.75 $\mu$m–1.25 $\mu$m. The magnitude of the reflectivity near the center wavelength of 1.0 $\mu$m exceeds 98%.

Figure 4:
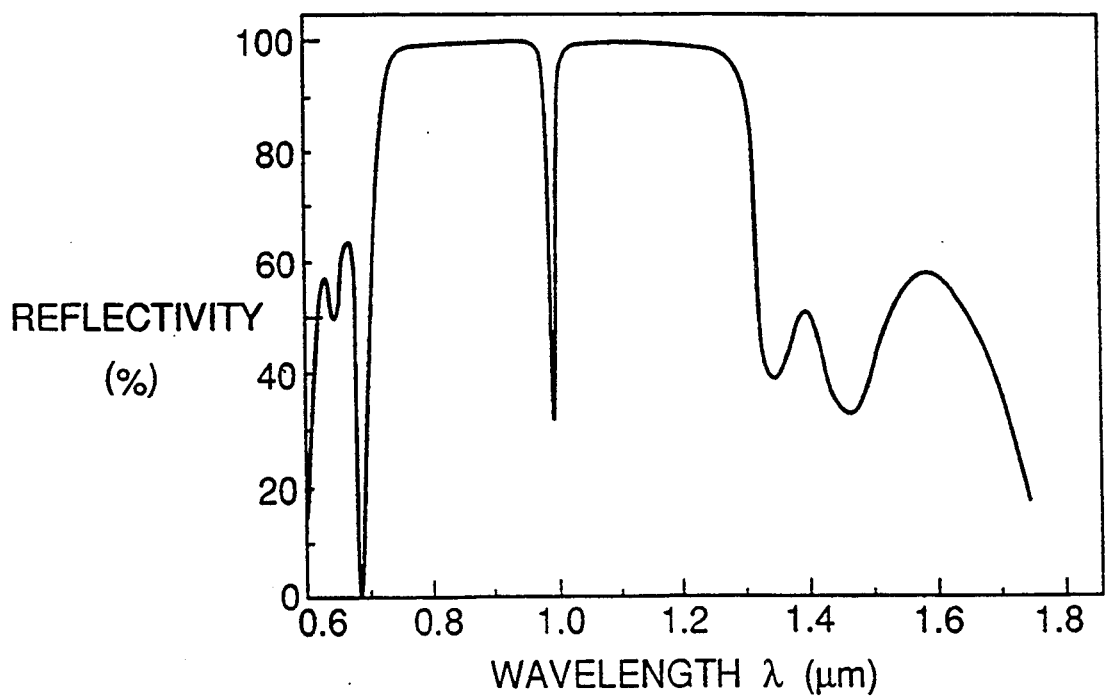
FIG. 4 is a plot of reflectivity for a resonant cavity with a four pairs of Si/SiO$_2$ bottom DBR, a $\lambda$/2 SiO$_2$:Er active region, and a 2½ pairs of Si/SiO$_2$ top DBR, resonant at 995 nm.

The reflectivity spectrum of the complete Fabry-Perot microcavity, shown in FIG. 4, also displays the broad reflectivity band. However, the reflectivity exhibits a dip at 0.995 $\mu$m which is the fundamental resonance mode of this cavity. At the resonance wavelength of the microcavity the transmission of a Fabry-Perot cavity approaches unity. The full-width at half-minimum of the resonance mode is 9 nm which translates into a cavity quality factor of $Q = \lambda/\Delta\lambda = 110$. This is a remarkably high value since the Si used in the bottom and top DBRs absorbs light due to interband transitions at $\lambda < 1.1$ $\mu$m. The clear cavity-resonance mode shown in FIG. 4 demonstrates, however, that the Si/$SiO_2$ material system is well suited for construction of high Q micro-cavities resonant at $\lambda \simeq 1$ $\mu$m, and that the use of a source of excitation radiation at or near this wavelength would be useful as the pumping source. Thus, this type of a cavity would be suitable for use with lasers with 980 nm radiation.

Next, one should consider resonant absorption effect of the cavity on the luminescence intensity. Without a top and a bottom reflectors, the exciting light passes through the active region only once and only few photons excite Er atoms. In the presence of a structure with an active region and a bottom reflector only, the laser light traverses the active region twice, that is it passes through the active region to the bottom reflector and, after bouncing off the reflector, passes through and out of the active region. Therefore, if an absorption of the active layer is taken as a unity, the no-cavity absorption shall amount only to a value twice the value of the active layer without the mirrors. In the presence of a full cavity, however, photons traverse the active region of the cavity many times bouncing between the top and bottom reflectors. For this situation an enhancement factor of the absorption, $G_a$, is given by:

$$G_a = \frac{2(1 - R_1)}{(1 - \sqrt{R_1 R_2})^2} \simeq \frac{4}{\pi} F = \frac{4}{1 - \sqrt{R_1 R_2}} \quad (1)$$

where $R_1$ and $R_2$ are the reflectivities of the top and bottom reflector, respectively, and F is the finesse of the cavity. For the derivation of Eq. (1) it was assumed that $R_2 >> R_1$ and that the 980 nm absorption per single pass is very small. Furthermore, the absorption of 980 nm light in the Si layers of the DBR is neglected. Note, however, that any absorption of the exciting 980 nm light in the Si layers of the DBR will reduce the enhancement. Using $R_1 = 99.8\%$ and $R_2 = 98.5\%$, it can be calculated that $F = 368$ and an enhancement factor of $G_a = 468$. Also, the expected enhancement of the full cavity structure relative to the no-cavity structure is just half as large, i.e. $G_a=234$.

The experimental intensity enhancement of the no-cavity structure with Er-doped $SiO_2$ active layer and with only the bottom reflector and of the cavity structure with an Er-doped $SiO_2$ active layer and the top and bottom reflectors has been compared with the above calculated intensity enhancement. The photoluminescence set-up shown in FIG. 1 was used to conduct the experimental comparison tests. In the specific example, a 100 mW 980 nm semiconductor laser, 12, (Spectra Diode Labs) was used as an excitation source. The angle, $\Theta$, between the direction of optical excitation, 13, and the optical axis, 20, of the cavity can be varied, as indicated in FIG. 1. A Fourier-transform infra-red spectrometer was used as an optical detection system, 21.

Figure 5:
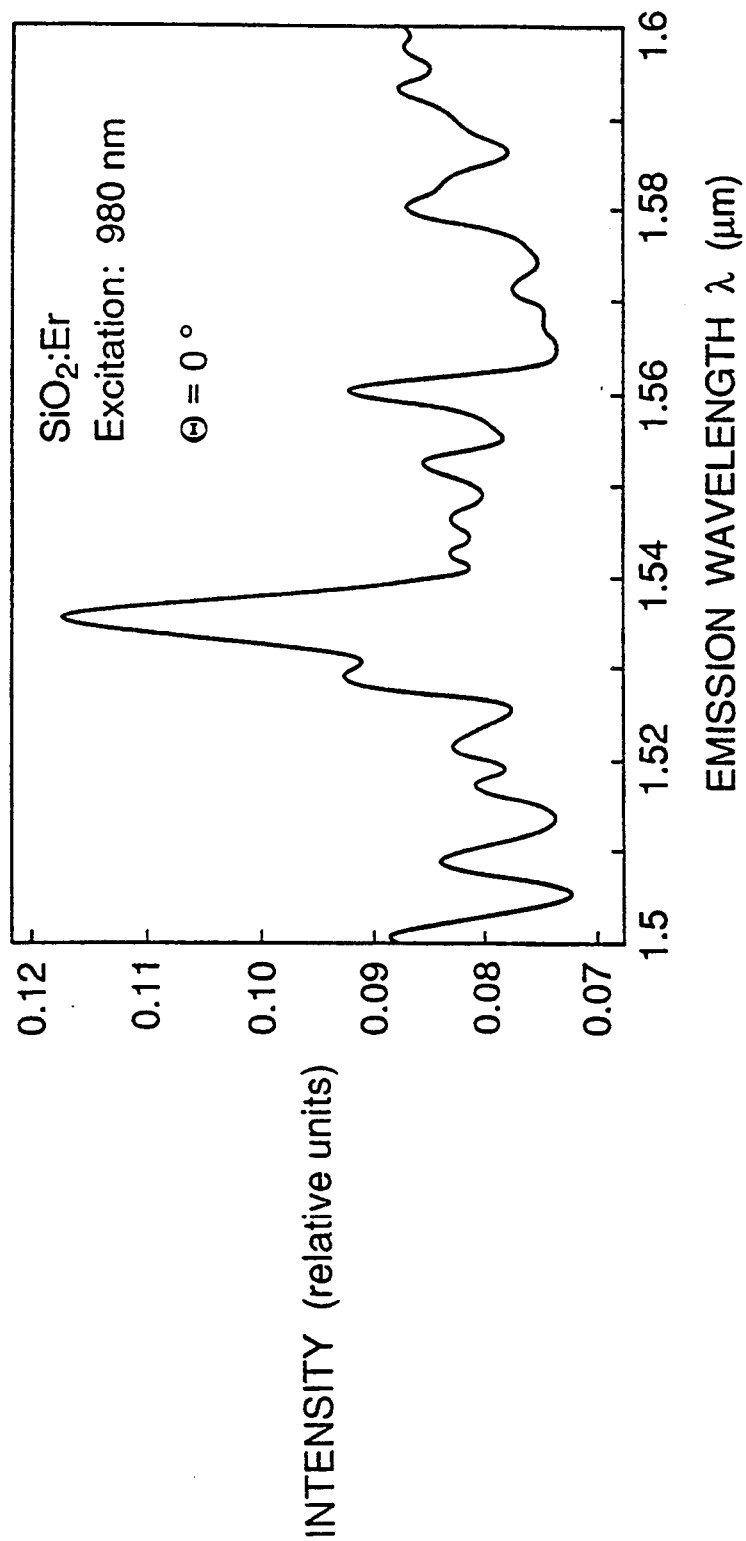
FIG. 5 is a plot of room-temperature photoluminescense spectrum of a SiO$_2$:Er layer excited at $\lambda$=980 with light incident perpendicularly to the surface of the layer.

The photoluminescence spectrum of a no-cavity structure (an Er-doped $SiO_2$ layer grown on top of a 4 pair $SiO_2$/Si bottom DBR) is shown in FIG. 5. The tests were conducted with radiation directed normal to the surface of the active layer. The main Er-related peak at 1.535 μm has an intensity of 0.036 relative units, which is a factor of 28 weaker as compared to the cavity structure. Comparison of the experimental enhancement with the calculated enhancement indicates that absorption of the 980 nm light in the Si layers of the DBR is significant. Note that the 980 nm exciting light has an energy above the bandgap energy of Si and absorption is therefore expected to be significant. An absorption coefficient of $\alpha=1000$ cm$^{-1}$ at 980 nm can fully account for the experimental enhancement. The luminescence spectra shown in FIG. 5 displays 'noise' of average intensity 0.08 relative units, which is due to defect luminescence from the Si substrate. The defect luminescence can be clearly separated from the Er signal.

Figure 6:
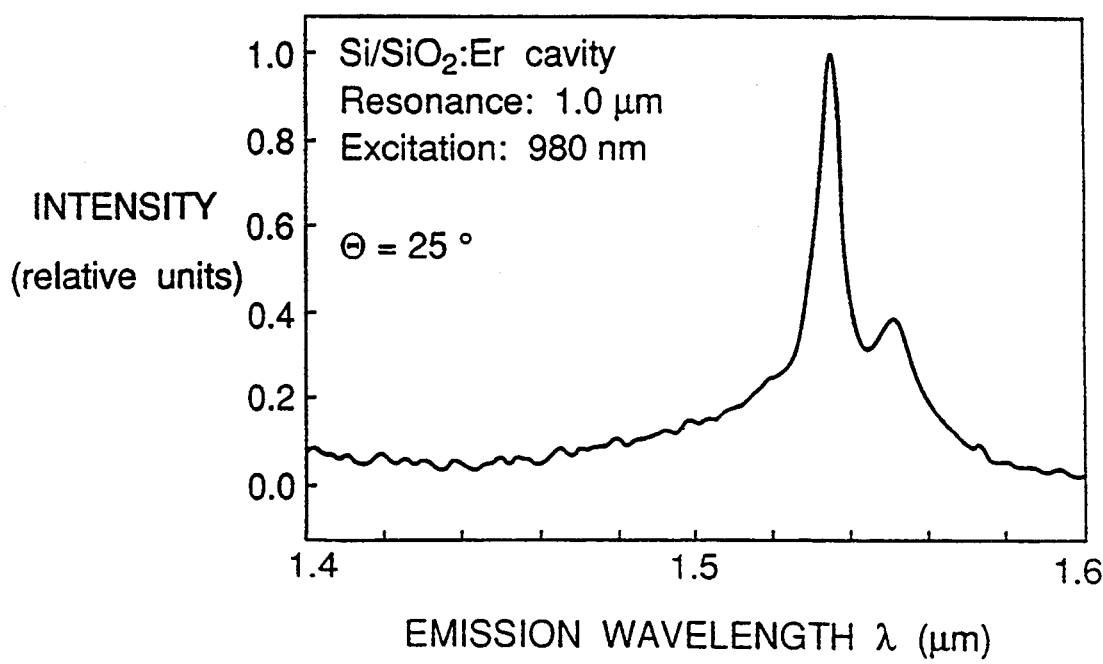
FIG. 6 is a plot of room temperature luminescence spectrum of an Er-doped Si/SiO$_2$ microcavity of FIG. 2 which, at $\Theta$=25° from the normal to the surface of the microcavity, is resonant with the excitation wavelength of $\lambda$=980 nm.
Figure 7:
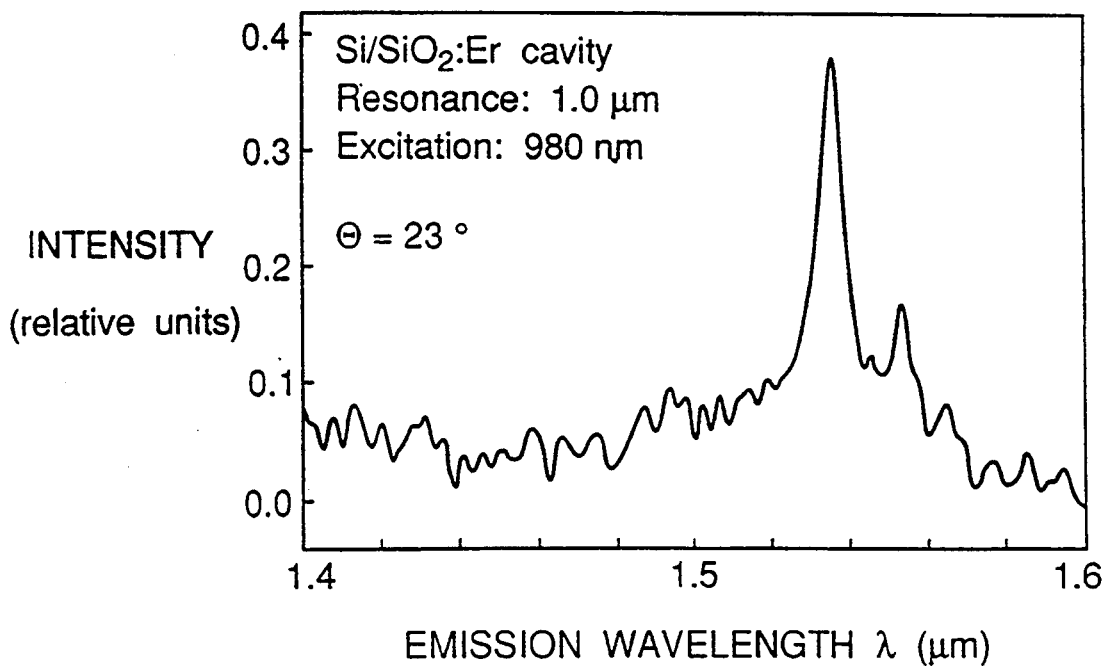
FIG. 7 is a plot of a room temperature photoluminescence spectrum of an Er-doped Si/SiO$_2$ microcavity of FIG. 2 which, at $\Theta$=23° from the normal to the surface of the microcavity, is slightly off resonance with the excitation wavelength of $\lambda$=980 nm and exhibits lower intensity of the Er luminescence as in FIG. 6.

The photoluminescence measurements for cavity 11 were carried out with a beam 13 of semiconductor laser 12 having 980 nm wavelength and being off the optical axis of the cavity by an angle $\Theta$. The off-normal excitation of the cavity allows to tune the resonance of the cavity to 980 nm, since the resonance wavelength depends on the angle $\Theta$. The luminescence signal from the Er emission line at 1.535 μm has maximum intensity at an excitation angle of $\Theta=25°$. The corresponding Er luminescence spectrum is shown in FIG. 6. The intensity of the $\lambda=1.535$ μm peak of the Er spectrum is normalized to unity (1.0) and serves as a reference intensity for all other intensities presented herein. Shown in FIG. 7 is a luminescence spectrum obtained for the same cavity but at an excitation angle of $\Theta=23°$. Here, the intensity of the luminescence spectrum at $\Theta=23°$ is less than half the intensity of the luminescence spectrum at $\Theta=25°$. Note that in both of these plots the Er spectra exhibit the typical double-peak structure with the major line at 1.535 μm and a secondary line at 1.55 μm. Thus, the shape of optical emission spectrum is not influenced by the micro-cavity, since the 1.5 μm (1.535–1.55) Er emission band is well outside the DBR reflectivity band and off the cavity resonance.

The excitation-angle dependence of the 1.535 μm Er emission line of a Si/$SiO_2$:Er cavity 11 constructed to be resonant at an excitation wavelength of 980 nm is shown in FIG. 8. The dotted line represents a fit to the experimental points. The peak luminescence intensity exhibits a narrow maximum at $\Theta=25°$. The cavity, which is resonant at approximately 1.0 μm for $\Theta=0°$, is resonant at 980 nm for an excitation angle of $\Theta=25$.

The full-width at half-maximum of the dashed curve is 4°.

The strong luminescence enhancement observed in the absorption-resonant micro-cavity has potential applications in an entire range of optical devices. The enchanced efficiency of Er excitation offered by the resonant absorption Er-doped cavity may be useful for optical amplifiers and other devices. As an example, optical amplifiers may be considered for 1.55 μm optical communication systems. It is desirable that the signal light propagation direction and the pump light direction be orthogonal. Such orthogonality is not feasible in conventional amplifiers due to the weak oscillator strength of the 980 nm Er absorption transition.

In FIG. 9 is shown the set-up partially similar to that shown in FIG. 1. The Fabry-Perot cavity including reflectors 15 and 17 and rare-earth doped active region 16, is being pumped with excitation wavelength from source 12. However, in this embodiment, sidewalls of the cavity are provided with additional reflectors, 22 and 23, so that emission takes place horizontally of the cavity and may be detected by an optical detection system 24. In this embodiment the reflectivities of reflectors 15 and 17 are made equal, thus enhancing oscillation of the radiation along the cavity and between reflectors 22 and 23 with emission taking place through one or even both of the latter reflectors.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

We claim:

1. A light-emitting device which comprises in an ascending order, a substrate, a bottom reflector, an active layer, and a top reflector, said reflectors forming a Fabry-Perot cavity enclosing said active layer, said active layer is doped with a rare earth element selected from lanthanide series elements with numbers 57 through 71, said rare-earth element being selected on basis of its optical transition so as to provide electroluminescence at a desired emission wavelength, wherein
the material of the active layer, the thickness of the active layer, the wavelength of excitation radiation and an angle, $\Theta$, at which said radiation impinges on the top reflector are selected such that the fundamental mode of the cavity is in resonance with the excitation wavelength, said active layer including a host material selected from materials which either are not capable of spontaneous luminescence or whose luminescence is of such minor intensity as not to be considered emissive at the wavelength of the rare earth element, the thickness of the active layer being a whole number multiple of $\lambda/2$ wherein $\lambda$ is the wavelength of excitation radiation divided by the index of refraction of the material of the active layer, said number being one of the numbers ranging from 1 to 5, and the wavelength of excitation radiation of the source of radiation being substantially smaller than said emission wavelength.

2. The light-emitting device of claim 1 in which said rare earth element comprises erbium, and said device is capable of spontaneous photoluminescence at an emission wavelength of approximately 1.5 μm.

3. The light-emitting device of claim 1 in which said angle Θ ranges from zero degrees to less than 90 degrees from the normal to the top surface of the top DBR of the cavity.

4. The light-emitting device of claim 1 in which said host material comprises $SiO_2$, one layer in each pair of layers comprises $SiO_2$ and another layer in the pair comprises Si, and said wavelength of excitation radiation is selected such that the cavity is resonant at an absorption wavelength of the said cavity.

5. The light-emitting device of claim 1 in which said host material comprises material selected from the group consisting of $SiO_2$, $Al_2O_3$, $TiO_2$ phosphosilicate glass, borosilicate glass, borophosphosilicate glass, boron aluminum silicate glass, germanate glass, tellurite glass, fluoride glass, and $Si_3N_4$.

6. The light-emitting device of claim 1 in which said host material comprises material selected from the group consisting of Si, GaAs, GaP, InP, GaInAs and GaInPAs.

7. The light-emitting device of claim 1 in which said reflectors are selected from distributed Bragg reflectors (DBRs), metals, conductive oxides, and their combinations so as to provide the said fundamental mode of the cavity.

8. The light-emitting device of claim 1 in which said host material is selected from glass-like materials and tetrahedrally bonded semiconductor materials, said reflectors are DBRs, the number of pairs of layers in the bottom DBR ranging from 2 to 10, the number of pairs of layers in the top DBR being smaller than the number of pairs of layers in the bottom DBR and ranging from 1.5 to 4.5, and said top DBR includes
a capping layer on top of the top DBR.

9. The light-emitting device of claim 8 in which the material of said layers of the DBR is selected from the group consisting of Si, Ge, $SiO_2$, $Al_2O_3$, and $TiO_2$, such that the two layers in each pair have different refractive indices.

10. The light-emitting device of claim 9 in which the active layer comprises $SiO_2$ and the layers in the bottom DBR begin with $SiO_2$ adjacent the substrate and end with Si adjacent the active layer, and
the layers in the top DBR begin with Si adjacent the active layer.

11. The light-emitting device of claim 9 in which the number of pairs of layers in the bottom DBR is 4 and layers in the top DBR is 2.5 with an upper layer of the top DBR acting as the capping layer.

12. The light-emitting device of claim 1 in which side walls of the cavity are provided with additional reflectors permitting radiation oscillation between the additional reflectors and emission of radiation through at least one of the additional reflectors.

13. The light-emitting device of claim 12 in which the reflectivities ($R_1$ and $R_2$) of the two reflectors of the cavity are equal.

14. The light-emitting device of claim 12 in which the reflectivities ($R_3$ and $R_4$) of the two additional mirrors are dissimilar.

* * * * *